US006004681A

United States Patent [19]
Epstein et al.

[11] Patent Number: 6,004,681
[45] Date of Patent: Dec. 21, 1999

[54] LIGHT-EMITTING DEVICES CONTAINING NETWORK ELECTRODE POLYMERS IN ELECTRON BLOCKING LAYER

[75] Inventors: Arthur J. Epstein, Bexley; Yunzhang Wang, Columbus, both of Ohio

[73] Assignee: The Ohio State University Research Foundation, Columbus, Ohio

[21] Appl. No.: 08/902,145

[22] Filed: Jul. 29, 1997

Related U.S. Application Data

[60] Provisional application No. 60/023,071, Aug. 2, 1996.

[51] Int. Cl.$^6$ ...................................................... B32B 15/04
[52] U.S. Cl. ........................ 428/457; 428/690; 428/917; 313/504; 313/506; 257/13; 257/94
[58] Field of Search ..................................... 428/457, 690, 428/917; 313/504, 506; 257/13, 94

[56] References Cited

U.S. PATENT DOCUMENTS

| | | | |
|---|---|---|---|
| 5,247,190 | 9/1993 | Friend et al. | 257/40 |
| 5,486,406 | 1/1996 | Shi | 428/209 |
| 5,652,067 | 7/1997 | Ito et al. | 428/917 |
| 5,719,467 | 2/1998 | Antoniadis et al. | 428/690 |

OTHER PUBLICATIONS

Blachford et al., *Time Resolved Vibtational Spectroscopy*, 64, 120–135 (1995).
Blatchford et al., *Physical Review Letters*, 76, 1513–1516 (Feb. 1996).
Blatchford, et al., *Electronic Structure of Pyridine–Based Polymers*, 1–47.
Blatchford, et al., Am. J. Phys., 64, 120–135 (Feb. 1996).
Blatchford, et al., *Mat. Res. Soc.,* Symp. Proc., 413, 671–676 (1996).
Blatchford, Ph.D thesis, The Ohio State University (1996).
Bradley, *Synth. Met.,* 54, 401 (1993).
Braun and A. J. Heeger, *Appl. Phys. Lett.* 58, 1982 (1991).
Burroughes et al., *Nature* 347, 539 (1990).
Epstein et al., *Polymer Reprints,* 37, 133–134 (1996).
Epstein, et al., Macromolecular Symposia, 1–12.
Epstein, et al., Synthetic Metals, 78, 253–261 (1996).
Gebler et al., *J. Appl. Phys.* 78, 4264 (1995).
Greenham et al., *Nature* 365, 628 (1993).
Jensen, et al., Absorption and Luminescence of Pyridine–Based Polymers, 1–6.
Jessen et al., Direct and Photoinduced Adsorption in Poly(p-pyridyl vinylene): Morphological Control of Triplet Exections and Polarons, 0–14, (1995).
Jessen et al., *Poly. Mat. Sci & Eng.,* 72, 573–574 (1995).
Jessen et al., Proc. Soc. of Plastics Engineers Annual Technical Conf. 1433–1436 (1996).
MacDiarmid et al., Proc. Summer Topical Meetings (Aug. 1995).
MacDiarmid, et al., IS&T's 49th Annual Conference, 381–384 (1996).
MacDiarmid, et al., Mat. Res. Soc. Symp. Proc., 413, 3–12 (1996).
MacDiarmid, et al., Novel Light Emitting Diodes involving Hertocyclic Aromatic Conjugated Polymers, *Proceedings of Society of Photo–Optic Instrumentation and Engineering,* 11 pages (1995).
MacDiarmid, et al., Proc. Soc. of Plastics Engineers Annual Tech. Conf., 1314–1317 (1996).
MacDiarmid, et al., Proceedings Multifunctional Polymers Workshops, 4 (1996).
MacDiarmid, Proc. Soc. of Plastics Eng. Ann. Tech. Conf., 1314–1317 (1996).
Marsella et al., *Adv. Mater.,* 7, 145 (1995).
Miyamae et al., *J. Chem. Phys.,* 103, 2738 (1995).
Quillard et al., *Nonlinear Optics,* 10, 253–262 (1995).
Scherf and Müllen, ,*Makromol. Chem., Rapid Commun.,* 12, 498–497 (1991).
Scherf and Müllen, *Advances in Polymer Science,* 123, 1–40 (1995).
Scherf and Müllen, *Synthesis,* pp. 23–38 (Jan./Feb. 1992).
Wang et al., , *Appl. Phys. Lett.,* 68, 894–896 (Feb. 1996).
Wang et al., *Appl. Phys. Lett.* 68, 894 (1996).
Wang et al., *Int. Soc. for Opt. Eng.,* 2528, 54–61 (1995).
Wang et al., Light–emitting Devices based on Pyridine–Containing Conjugated Polymers, 1–4 (1996).
Wang et al., Mat. Res. Soc. Symp. Proc., 413, 115–120 (1996)..
Wang et al., *Poly. Preprints,* 36(2), 45–46 (1995).
Wang et al., *Synthetic Metals,*78, 33–37 (1996).
Wang et al.,Proc. Soc. of Plastics Eng. Ann. Tech. Conf., 5 pgs. (1996).
Wei et al., *J. of the Am. Chem. Soc.,* 118,2545–2555 (1996).
Yang et al., *J. Appl. Phys.* 77, 694 (1995).
Yamamoto et al., *Chem. Lett.,* 153 (1988).

*Primary Examiner*—John M. Cooney, Jr.
*Attorney, Agent, or Firm*—Standley & Gilcrest LLP

[57] ABSTRACT

In general terms, the present invention includes a light emitting polymeric material, the polymeric material comprising: (a) an electron transporting polymer; the electron transporting polymer in contact with (b) an electron blocking polymer, the electron blocking polymer incorporating a network electrode polymer. Such devices may be bilayer or multilayer devices, in accordance with arrangements known in the art. Likewise, the source of electrical current may be from any appropriate source having the electrical characteristics sufficient to and appropriate for the desired device make-up and application.

8 Claims, 6 Drawing Sheets

R = $C_{12}H_{25}$, $COOC_{12}H_{25}$, $OC_{16}H_{33}$ $R_1$ = $OC_{16}H_{33}$, $R_2$ = $(CH_2)_{10}$

LIGHT-EMITTING DEVICES CONTAINING NETWORK ELECTRODE POLYMERS IN ELECTRON BLOCKING LAYER

This application claims the benefit of U.S. Provisional Application Ser. No. 60/023,071 filed Aug. 2, 1996.

TECHNICAL FIELD

The present invention is in the field of light-emitting polymers and light emitting devices produced therefrom.

BACKGROUND

Since the report in 1990 of electroluminescence (EL) in poly(p-phenylene vinylene) (PPV) [1], EL of conjugated polymers has been considered an important property with many potential applications. Electroluminescence combined with other unique properties of polymers, such as solution processibility, band gap tunability, and mechanical flexibility, make conjugated polymers excellent candidates for low cost large area display applications. In addition to PPV, a variety of PPV derivatives and other conjugated polymers and copolymers have been found to exhibit electroluminescent properties [2,3]. Light-emitting devices incorporating these materials have demonstrated all the necessary colors needed for display applications.

Since the initial fabrication, a number of techniques have been developed to improve the device performance. One way is to use a low workfunction metal, such as Ca, as the electron injecting electrode (cathode) [4]. The double charge injection mechanism of polymer light-emitting diodes (LEDs) requires the match of cathode (anode) workfunction to the corresponding LUMO (HOMO) level of the polymer in order to achieve efficient charge injection. The relatively small electron affinity of most conjugated polymers requires metals with very low workfunctions to achieve efficient electron injection. However, since low workfunction metals are generally oxygen reactive, devices with low workfunction cathode are usually unstable. Thus, polymers with high electron affinities are desirable.

Another common technique is to incorporate charge transporting layers in a multilayer device structure. The charge transporting layer enhances the transport of one type of charge while blocking the other, achieving balanced charge injection and transport and spatially confined emission zone away from the electrodes. To date the highest efficiency polymer light-emitting devices reported are multilayer devices [5].

Pyridine-based conjugated polymers have been shown to be promising candidates for light-emitting devices [6,7]. As compared to phenylene-based analogues, one of the most important features of the pyridine based polymers is the higher electron affinity. As a consequence, the polymer is more resistant to oxidation and shows better electron transport properties. In contrast, most other conjugated polymers are susceptible to oxidation and exhibit better hole transport properties. FIG. 1 shows the structures of the pyridine-containing polymers and copolymers, namely poly(p-pyridine) (PPy), poly(p-pyridyl vinylene) (PPyV), and copolymers of PPyV and PPV (PPyVP(R)$_2$V) with various functional sidegroups R=C$_{12}$H$_{25}$, OC$_{16}$H$_{33}$, COOC$_{12}$H$_{25}$. With respect to π electronic levels, C$_{12}$H$_{25}$ is slightly electron donating; OC$_{16}$H$_{33}$ electron donating; and COOC$_{12}$H$_{25}$ electron withdrawing. The pyridine-based polymers are highly luminescent, especially the copolymers. The internal photoluminescent quantum efficiencies of the copolymers have been measured [8] to be 75–90% in solution and 18–30% in film, with the exception of the OC$_{16}$H$_{33}$ copolymer. The electron donating nature of OC$_{16}$H$_{33}$ makes this copolymer more susceptible for oxidation. As a result, the PL quantum efficiency of the OC$_{16}$H$_{33}$ copolymer is only 2% in film although it is high (~80%) in solution. To reduce the oxidation effects, the strapped copolymer (@PPyVPV) was introduced, as shown in FIG. 1(d). Also the strapped copolymer shows fewer aggregation effects as compared to the "usual" copolymers (see FIG. 1).

It is an object of the present invention to improve the performance of light-emitting polymers, such as reducing the required voltage required, and thus achieving similar levels of brightness while reducing the amount of power required for electroluminescence.

In view of the present disclosure or through practice of the present invention, other advantages may become apparent.

SUMMARY OF THE INVENTION

In general terms, the present invention includes a light emitting polymeric material, the polymeric material comprising: (a) an electron transporting polymer; the electron transporting polymer in contact with (b) an electron blocking polymer, the electron blocking polymer incorporating a network electrode polymer. Such devices may be bilayer or multilayer devices, in accordance with arrangements known in the art. Likewise, the source of electrical current may be from any appropriate source having the electrical characteristics sufficient to and appropriate for the desired device make-up and application.

The electron transporting polymer may be any conductive polymeric material of appropriate conductive and electron affinity characteristics to allow it to act as the electron transporting polymer in a light emitting device. Examples of such polymers include pyridine-containing conjugated polymers and copolymers, and their derivatives. Likewise, the electron blocking polymer may be any polymeric material of appropriate electron-blocking characteristics to allow it to act as the electron blocking polymer in a light emitting device, such as those selected from the group consisting of poly(vinylcarbazoles) and their derivatives.

The network electrode polymer may be any polymeric material that forms an electrically conducting network polymeric structure within the electron blocking polymer. Examples include camphor sulfonic acid doped polyanilines. The network electrode polymers of the present invention may be produced through methods known in the art such as those used in the synthesis of extended π-systems [17] and in the synthesis of ladder polymers [18].

The present invention also includes light emitting devices incorporating light emitting polymeric materials of the present invention. In general terms, such devices comprise: (a) an electron transporting polymer; the electron transporting polymer in contact with (b) an electron blocking polymer, the electron blocking polymer incorporating a network electrode polymer; and (c) a source of electrical current so as to supply the electron transporting polymer with a flow of electrons, so as to cause an electroluminescent emission from the heterojunction between the electron transporting polymer and the electron blocking polymer.

In accordance with the present invention, there is disclosed light-emitting devices based on the pyridine-containing polymers and copolymers in various device configurations. The high electron affinity of pyridine based polymers enables the use of relatively stable metals such as Al or even ITO as electron injecting contacts. Taking advantage of the better electron transport properties of the pyridine-containing polymers, we fabricate bilayer devices utilizing poly(9-vinyl carbazole) (PVK) as hole transporting/electron blocking polymer, which improves the device efficiency and brightness significantly due to the charge confinement and exciplex emission at the PVK/emitting polymer interface. The incorporation of conducting polyaniline network electrode to PVK reduces the device turn on voltage significantly while maintaining the high efficiency. The control of the aggregation in the polymer films by blending with insulating host polymers open up the possibility of making voltage-controlled multi-color light-emitting devices. The capability of eliminating the use of low workfunction metals makes the pyridine based polymers an excellent candidate for polymer light-emitting devices.

BRIEF DESCRIPTIONS OF THE DRAWINGS

Figure 5:
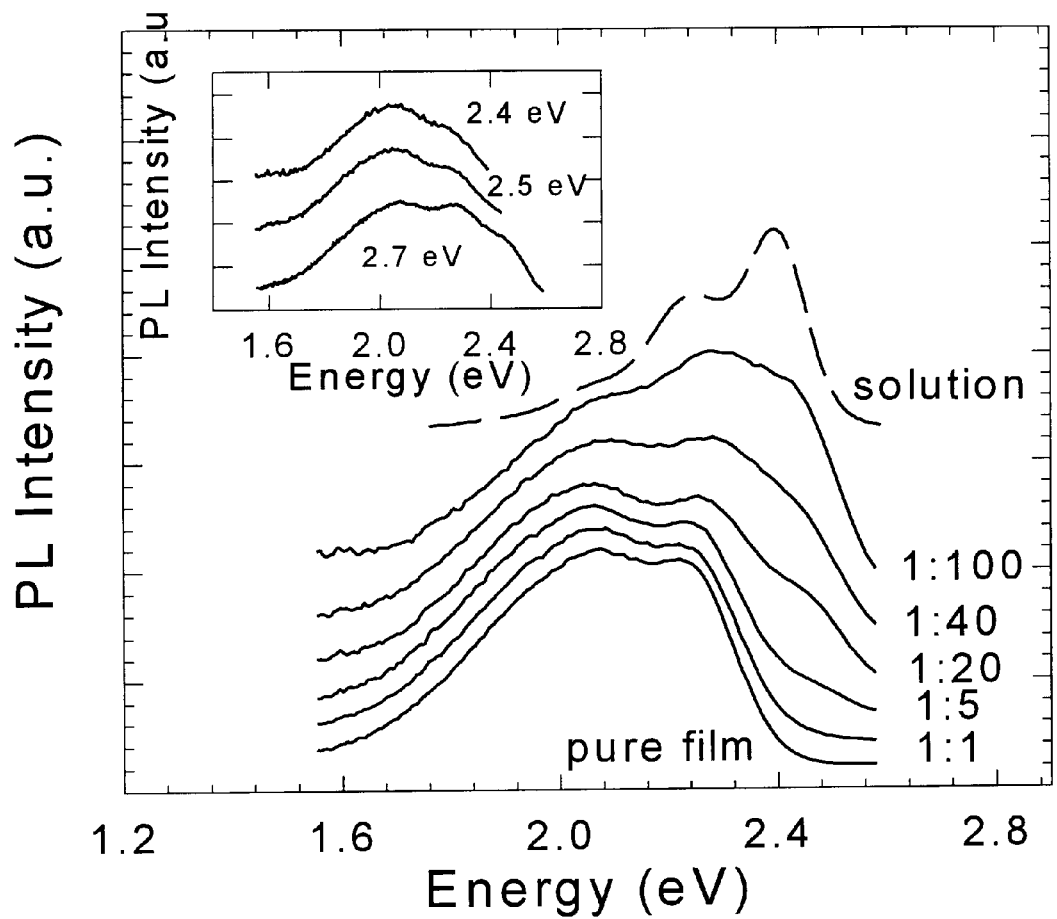

FIG. 5 shows a film PL of the pure wrapped copolymer and its blends with PMMA in various ratios with an excitation energy of 2.65 eV, and solution PL of the copolymer in xylenes. Inset: Film PL of a 1:20 blend with different excitation energies as indicated in the graph. Spectra are offset for clarity.

Figure 6:
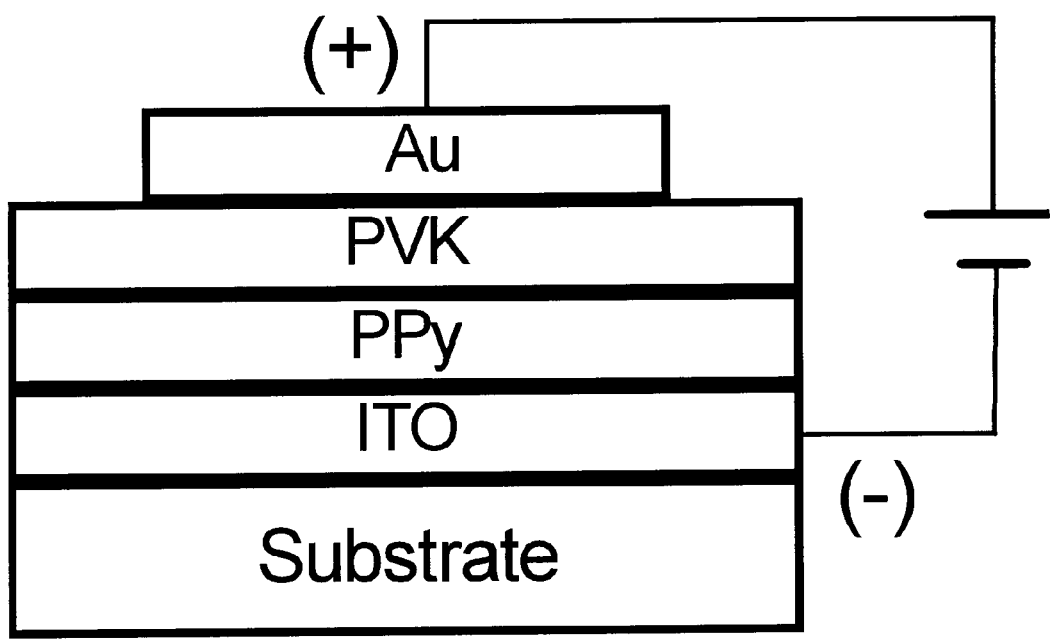

FIG. 6 shows a schematic structure of an inverted light-emitting devices with PPy as emitting layer and PVK as hole transporting layer.

DETAILED DESCRIPTION OF THE PREFERRED EMBODIMENTS

In accordance with the foregoing summary of the invention, the following presents a detailed description of the preferred embodiment of the invention which is presently considered to be its best mode.

Figure 1A:
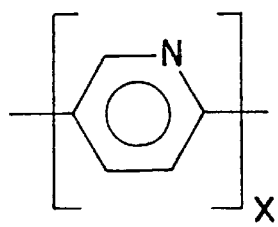
FIG. 1 shows the chemical structures of pyridine-based conjugated polymers and copolymers: (a) poly(p-pyridine) (PPy), (b) poly(p-pyridyl vinylene) (PPyV), (c) copolymers of PPyV and PPV derivatives (PPyVP(R)$_2$V) with various functional sidegroups R=C$_{12}$H$_{25}$, OC$_{16}$H$_{33}$, COOC$_{12}$H$_{25}$, and (d) strapped copolymer (@PPyVPV).
Figure 1B:
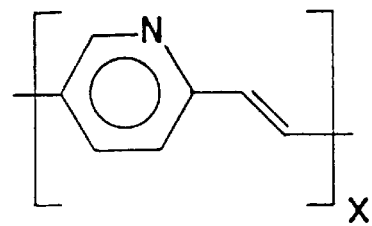
Figure 1C:
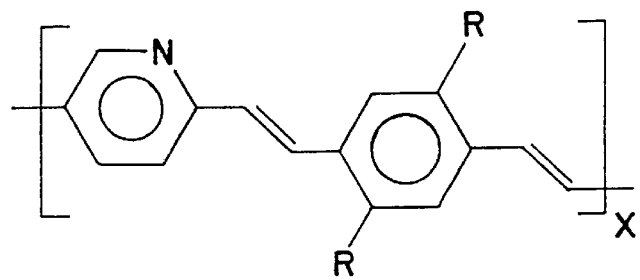
Figure 1D:
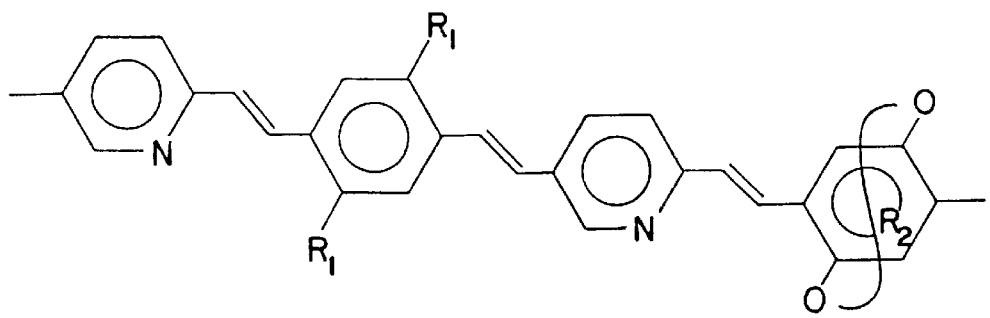
Figure 2:
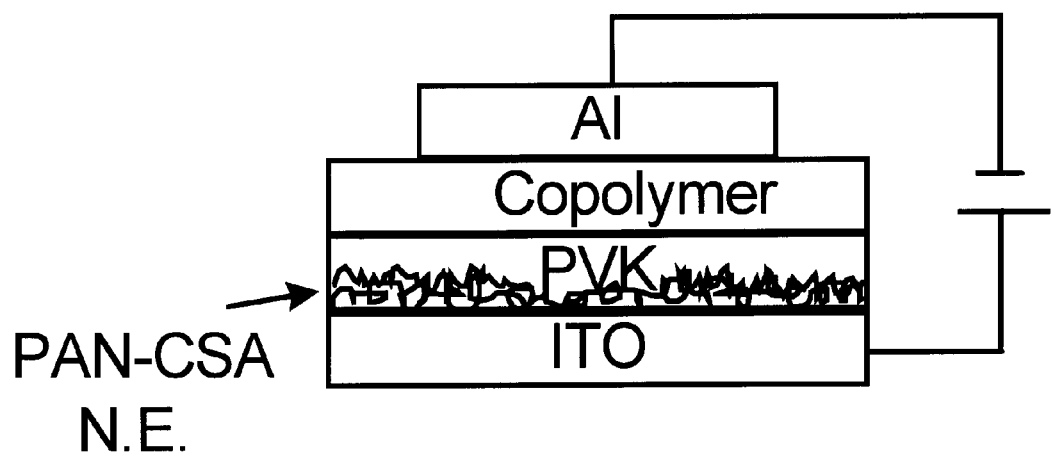
FIG. 2 shows a schematic structure of a bilayer device with conducting polyaniline network electrode in accordance with one embodiment of the present invention.

The synthesis of the pyridine-containing polymers has been reported earlier [9–10]. For single layer devices, the emitting layer was spin-cast from solutions in formic acid (for PPy and PPyV) or xylenes (for copolymers) (with a concentration ~10 mg/ml) onto pre-cleaned patterned ITO substrates with sheet resistance of ~15 Ω/square at 1000–2000 rpm. For bilayer devices, PVK layer was spin coated onto ITO substrate from solution in tetrahydrofuran (THF) (~10 mg/ml) at ~3000 rpm. The emitting layer was then spin coated on top of the PVK layer from appropriate solutions. The conducting polyaniline network electrode was formed by a spin-cast blend of camphor sulfonic acid doped polyaniline (PAN-CSA) and low molecular weight host polymer poly(methyl methacrylate) (PMMA) (from Aldrich Chemical Co.) in an appropriate ratio in m-cresol. The host polymer PMMA was subsequently washed away by xylenes. The PVK and emitting layers were similarly coated as in the bilayer device. All solutions were filtered using Gelman Acrodisc CR PTFE 1 μm filters. The top metal electrode was deposited by vacuum evaporation at a pressure below 10$^{-6}$ torr. To prevent damage to the polymers, the substrate was mounted on a cold-water cooled surface during evaporation. FIG. 2 shows schematically the structure of a bilayer device with PAN-CSA network electrode.

Absorption spectra were measured on spin-cast films using a Perkin-Elmer Lambda 19 UVNVIS/NIR spectrometer. Photoluminescence (PL) and EL were measured using a PTI fluorometer (model QM-1). The current-voltage (I-V) characteristics were measured simultaneously with EL using two Keithley 195A multimeters while dc voltage was applied by a HP 6218A DC power supply.

Figure 3:
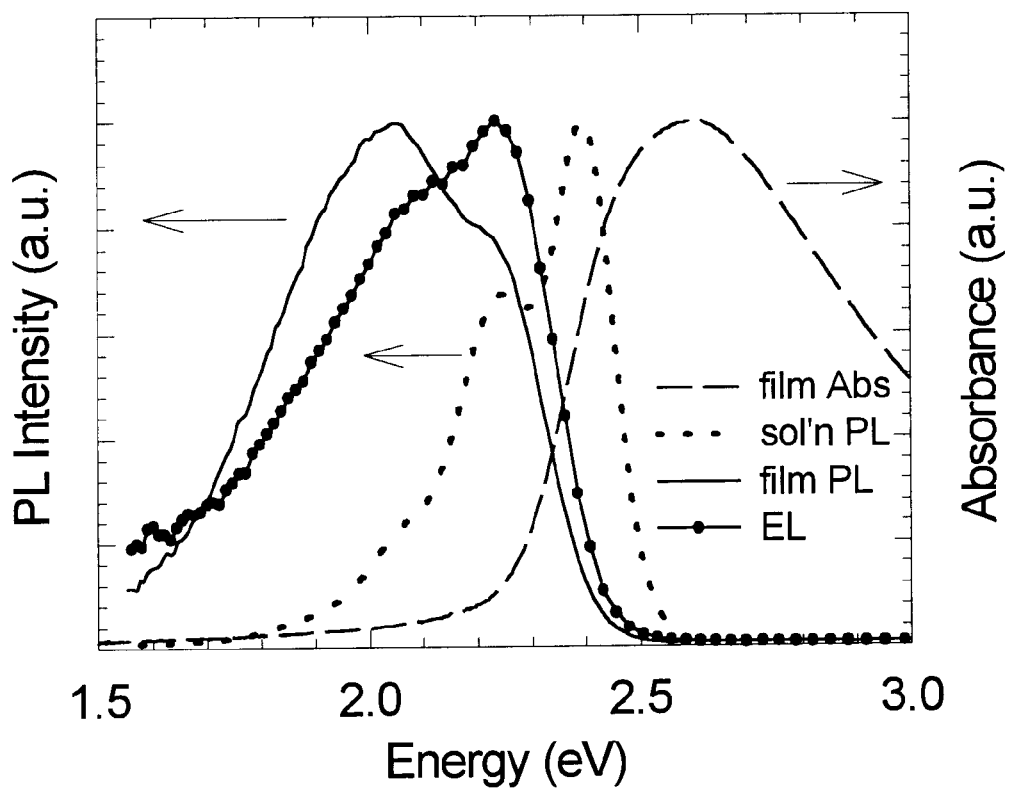
FIG. 3 shows a normalized optical absorption (dashed line) and PL of the strapped copolymer film (solid line), EL of a single layer device (solid line with dots), and PL of solution in xylenes (dotted line).

FIG. 3 shows the optical absorption and PL of the strapped copolymer film and EL of a single layer device. For comparison, the PL of the strapped copolymer solution in xylenes is also shown. The film PL peaks at 2.05 eV with a shoulder at 2.25 eV. As compared to the film absorbance, the peak of the film PL is redshifted 0.55 eV, which is attributed to the aggregates formed in the film [12]. The shoulder is suggested to come from the unaggregated site, and is supported by the PL measurements of blends in PMMA (see below). It is noted that although the strapped and the corresponding unstrapped copolymer show similar features in solution PL, no shoulder is found in the film PL for the unstrapped copolymer, indicating that the strapped side chains partially break the aggregates formation in the film. The reversed oscillator strength of the EL as compared to PL suggesting that the EL come mainly from unaggregated sites, although there is also a significant contribution from the aggregate emission.

Figure 4:
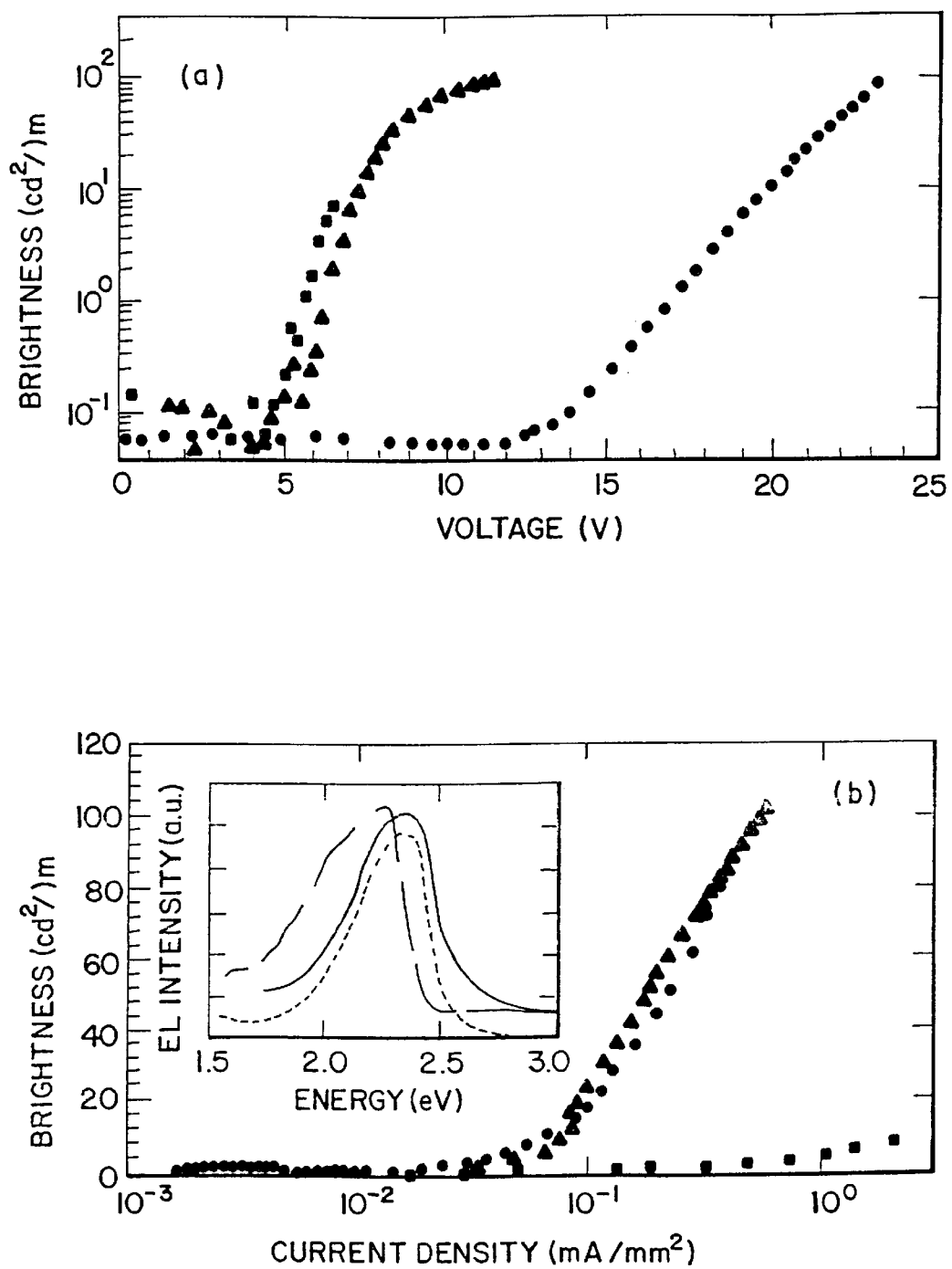
FIG. 4 shows a comparison of (a) light-voltage and (b) light-current characteristics for a single layer device (square), a bilayer device (circle), and a bilayer device with PAN-CSA network (triangle). Inset: EL spectra for the single layer device (dashed line), the bilayer device (solid line), and the bilayer device with network electrode (dotted line).

FIG. 4 compares the light-voltage (L-V) and EL-current (EL-I) characteristics for a single layer device, a bilayer device, and a bilayer device with PAN-CSA network electrode using the strapped copolymer as emitting layer. As compared to those of the single layer device, the quantum efficiency and brightness of the bilayer device increase more than two orders of magnitude, reaching ~0.3% and ~300 cd/m$^2$ respectively. PVK is a well known hole transporting/electron blocking polymer. Besides the function of enhancing the transport of holes injected from anode, it blocks the transport of electrons injected from cathode such that the electrons accumulate at the PVK/copolymer interface. This greatly enhance the probability of radiative recombination. In addition, the PVK layer separates the recombination zone from the metal electrode so that the radiative recombination is protected against the well known non-radiative quenching at the metal/polymer interfaces.

One side effect of using the PVK layer is that it increases the device operating voltage substantially. One effective way to reduce the device turn on voltage is to use high surface network electrode [13]. The concept behind the network electrode is that a rough electrode will create a non-uniform high electric field that enhances the charge injection. This technique has been successfully applied to PPV based devices [13]. By applying this technique to the PVK layer, the device operating voltage decreased significantly. For the devices shown here, the device operating voltage reduced from ~20 V to ~8 V (see FIG. 4(a)). Since the incorporation of the PAN-CSA network electrode does not modify the PVK/copolymer interface, the high quantum efficiency and brightness of the bilayer device are maintained (see FIG.

4(b)). Thus, the incorporation of the network electrode to the bilayer device improves the power efficiency dramatically.

The species that is responsible for the light generation in the bilayer device is attributed partially to exciplexes formed at the PVK/copolymer interface and is identified by the PL measurements [14]. FIG. 4(b) inset compares the EL spectra of a single and a bilayer device using the strapped copolymer as emitting layer. As compare to that of the single layer device, the peak of the bilayer device, which comes from the exciplex emission at the PVK/copolymer interface, is blue-shifted 0.15 eV. A shoulder in the bilayer EL at the peak of the single layer EL suggests that the strapped copolymer EL itself also contribute to the bilayer EL.

The large difference between the film and solution PL of the pyridine-based polymers opens up an opportunity for fabricating voltage-controlled color-variable light-emitting devices. The aggregates formed in the polymer films result in significantly red-shifted luminescence as compared to isolated chains in solution. One expects to reduce the red-shift of PL by breaking the aggregates formation. One effective way to break the aggregation is to blend the emissive polymer with an insulating host polymer, such as in PMMA. FIG. 5 shows the PL spectra of the pure wrapped copolymer and its blends with PMMA in various ratios. For comparison, the PL spectrum of the wrapped copolymer in solution is also shown. When the concentration of the emissive polymer decreases, the PL of the blends gradually blue shifted towards the solution PL, indicating partial break of the aggregation of polymer chains. Thus by choosing appropriate blend ratio, the emission color can be controlled. Furthermore, the PL spectra of the blends exhibit excitation energy dependence, as shown in FIG. 5 inset for a blend with 1:20 (copolymer:PMMA) ratio excited at different energies. As the excitation energy increases, the PL strength of the higher energy peak grows. In contrast, no excitation energy dependence is found in pure copolymer PL. The excitation energy dependence of the blend PL make it possible to fabricate voltage controlled multi-color light-emitting devices, and the work is in progress.

The high electron affinity of the pyridine-based polymers enables other novel device configurations such as inverted light-emitting devices that are capable of eliminating the use of low workfunction metals. Poly(p-pyridine) (PPy) has an electron affinity of ~3.5 eV [16], which allows metals with relatively high workfunction as electron injecting contact. In the inverted light-emitting devices with PPy as emissive layer, ITO and Au are used as electron and hole injecting contacts, respectively. The inverted (−)ITO/PPy/Au(+) device show improved device performance including quantum efficiency, brightness, operating stability and storage lifetimes as compared to the usual (+)ITO/PPy/Al(−) device. By inserting a PVK layer in between the PPy and Au, the device performance improves further FIG. 6 shows schematically the device structure of the inverted light-emitting device with PVK.

Conclusion

In summary, pyridine containing conjugated polymers and copolymers are excellent candidates for polymer light-emitting devices. The high electron affinity of pyridine based polymers enables the use of relatively stable metals such as Al or even ITO as efficient electron injecting contacts. Taking advantages of the better electron transport properties of the pyridine-containing polymers, we fabricate bilayer devices utilizing PVK as hole transporting/electron blocking polymer. The bilayer device structure improves the device quantum efficiency and brightness significantly due to the charge confinement and the exciplex emission at the PVK/emitting polymer interface. The incorporation of the conducting polyaniline network electrode to PVK reduces the device turn on voltage significantly while maintaining the high efficiency and brightness of the bilayer device. The control of the aggregation in the polymer films by blending with insulating host polymers opens up the possibility of making voltage-controlled multi-color light-emitting devices.

The following references are hereby incorporated herein by reference:

References

[1] J. H. Burroughes, D. D. C. Bradley, A. R. Brown, R. N. Marks, K. Mackay, R. H. Friend, P. L. Burns, and A. B. Holmes, Nature 347, 539 (1990).

[2] D. D. C. Bradley, Synth. Met. 54, 401 (1993).

[3] J. Kido, Trends in Polymer Science 2, 350 (1994).

[4] D. Braun and A. J. Heeger, Appl. Phys. Lett. 58, 1982 (1991).

[5] N. C. Greenham, S. C. Morattl, D. D. C. Bradley, R. H. Friend, and A. B. Holmes, Nature 365, 628 (1993).

[6] D. D. Gebler, Y. Z. Wang, J. W. Blatchford, S. W. Jessen, L. B. Lin, T. L. Gustafson, H. L. Wang, T. M. Swager, A. G. MacDiarmid, and A. J. Epstein, J. Appl. Phys. 78, 4264 (1995).

[7] Y. Z. Wang, D. D. Gebler, L. B. Lin, J. W. Blatchford, S. W. Jessen, H. L. Wang, and A. J. Epstein, Appl. Phys. Lett. 68, 894 (1996).

[8] J. W. Blatchford, Ph.D thesis, The Ohio State University (1996).

[9] T. Tamamoto, T. ITO, and K. Kubota, Chem. Lett., 153 (1988).

[10] M. J. Marsella, D. —K. Fu, and T. M. Swager, Adv. Mater. 7, 145 (1995).

[11] J. W. Blatchford, S. W. Jessen, L. —B. Lin, T. L. Gustafson, A. J. Epstein, D. —K. Fu, H. —L. Wang, T. M. Swager, and A. G. MacDiarmid, Phys. Rev. B, in press; J. W. Blatchford, T. L. Gustafson, A. J. Epstein, D. A. Vanden Bout, J. Kerimo, D. A. Higgins, P. F. Barbara, D. K. Fu, T. M. Swager, and A. G. MacDiarmid, Phys. Rev. B , in press.

[12] Y. Yang, E. Westerweele, C. Zhang, P. Smith, and A. J. Heeger, J. Appl. Phys. 77, 694 (1995).

[13] D. D. Gebler, Y. Z. Wang, J. W. Blatchford, S. W. Jessen, T. L. Gustafson, D. —K. Fu, T. M. Swager, A. G. MacDiarmid, and A. J. Epstein, this proceedings.

[14]

[15] T. Miyamae, D. Yoshimura, H. Ishii, Y. Ouchi, K. Seki, T. Miyazaki, T. Koike, and T. Yamamoto, J. Chem. Phys. 103, 2738 (1995).

[16] U. Scherf, K. Müllen, Design and Synthesis of Extended π-Systems: Monomers, Oligomers, Polymers, Synthesis, pp. 23–38 (January/February 1992).

[17] U. Scherf, K. Müllen, The Synthesis of Ladder Polymers, Advances in Polymer Science, Vol. 123, pp. 1–40, Springer-Verlag, Berlin (1995).

[18] U. Scherf, K. Müllen, Polyarenes and poly (arylenevinylenes), 7, A soluble ladder polymer via bridge of functionalized poly(p-phenylene)-precursors, Makromol. Chem., Rapid Commun., Huiltig & Wepf Velag, Basel, vol. 12, pp. 498–497 (1991).

The contents of U.S. Provisional Patent Application Ser. No. 60/023,071 are hereby incorporated herein by reference.

In view of the present disclosure or through practice of the present invention, it will be within the ability of one of rodinary skill to make modifications to the present invention, such as through the use of equivalent arrangements and compositions, in order to practice the invention without departing from the spirit of the invention as reflected in the appended claims.

What is claimed is:

1. A light emitting polymeric material, said polymeric material comprising:
   (a) an electron transporting polymer; said electron transporting polymer in contact with
   (b) an electron blocking polymer, said electron blocking polymer incorporating a network electrode polymer.

2. A light emitting polymeric material according to claim 1, wherein said electron tranporting polymer comprises a pyridine-containing conjugated polymers and copolymers.

3. A light emitting polymeric material according to claim 1, wherein said electron blocking polymer is selected from the group consisting of poly(vinylcarbazole).

4. A light emitting polymeric material according to claim 1, wherein said network electrode polymer comprises camphor sulfonic acid doped polyaniline.

5. A light emitting device, said device comprising:
   (a) an electron transporting polymer; said electron transporting polymer in contact with
   (b) an electron blocking polymer, said electron blocking polymer incorporating a network electrode polymer; and
   (c) a source of electrical current so as to supply said electron transporting polymer with a flow of electrons, so as to cause an electroluminescent emission from said heterojunction between said electron transporting polymer and said electron blocking polymer.

6. A light emitting device according to claim 5, wherein said electron tranporting polymer comprises a pyridine-containing conjugated polymers and copolymers.

7. A light emitting device according to claim 5, wherein said electron blocking polymer is selected from the group consisting of poly(vinylcarbazole).

8. A light emitting device according to claim 5, wherein said network electrode polymer comprises camphor sulfonic acid doped polyaniline.

* * * * *